US008860107B2

(12) United States Patent
Haensch et al.

(10) Patent No.: US 8,860,107 B2
(45) Date of Patent: Oct. 14, 2014

(54) FINFET-COMPATIBLE METAL-INSULATOR-METAL CAPACITOR

(75) Inventors: Wilfried E. Haensch, Somers, NY (US); Pranita Kulkarni, Slingerlands, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 416 days.

(21) Appl. No.: 12/793,292

(22) Filed: Jun. 3, 2010

(65) Prior Publication Data

US 2011/0298025 A1    Dec. 8, 2011

(51) Int. Cl.
| | |
|---|---|
| *H01L 27/108* | (2006.01) |
| *H01L 21/8234* | (2006.01) |
| *H01L 27/08* | (2006.01) |
| *H01L 27/06* | (2006.01) |

(52) U.S. Cl.
CPC .... *H01L 21/823431* (2013.01); *H01L 27/0805* (2013.01); *H01L 27/0629* (2013.01)
USPC .................... 257/296; 257/E21.008; 438/381

(58) Field of Classification Search
None
See application file for complete search history.

(56) References Cited

U.S. PATENT DOCUMENTS

| | | | | |
|---|---|---|---|---|
| 5,142,639 | A * | 8/1992 | Kohyama et al. | 257/306 |
| 6,020,239 | A * | 2/2000 | Gambino et al. | 438/269 |
| 2008/0211003 | A1* | 9/2008 | Lee et al. | 257/306 |
| 2008/0237675 | A1* | 10/2008 | Doyle et al. | 257/303 |
| 2008/0296648 | A1* | 12/2008 | Zhu | 257/300 |
| 2011/0156107 | A1* | 6/2011 | Bohr et al. | 257/288 |
| 2011/0175152 | A1* | 7/2011 | Booth et al. | 257/306 |
| 2011/0291166 | A1* | 12/2011 | Booth et al. | 257/296 |

\* cited by examiner

*Primary Examiner* — Johannes P Mondt
(74) *Attorney, Agent, or Firm* — Scully, Scott, Murphy & Presser, P.C.; Louis J. Percello, Esq.

(57) ABSTRACT

At least one semiconductor fin for a capacitor is formed concurrently with other semiconductor fins for field effect transistors. A lower conductive layer is deposited and lithographically patterned to form a lower conductive plate located on the at least one semiconductor fin. A dielectric layer and at least one upper conductive layer are formed and lithographically patterned to form a node dielectric and an upper conductive plate over the lower conductive plate as well as a gate dielectric and a gate conductor over the other semiconductor fins. The lower conductive plate, the node dielectric, and the upper conductive plate collectively form a capacitor. The finFETs may be dual gate finFETs or trigate finFETs. A buried insulator layer may be optionally recessed to increase the capacitance. Alternately, the lower conductive plate may be formed on a planar surface of the buried insulator layer.

20 Claims, 21 Drawing Sheets

US 8,860,107 B2

FINFET-COMPATIBLE METAL-INSULATOR-METAL CAPACITOR

BACKGROUND

The present invention relates to a semiconductor structure including a metal-insulator-metal capacitor (MIMCAP) compatible with finFET structures, and methods of manufacturing the same.

Capacitors are employed as passive components in a semiconductor chip. Capacitors are employed to decouple power supplies, to form a memory element, to form an RC delay circuit, and/or to provide various other circuit functions. Because capacitors tend to take up a significant circuit area, compact high capacitance capacitors are desirable for highly-integrated advanced semiconductor chips. At the same time, the number and complexity of additional processing steps for adding capacitors should be minimized in order to contain the total processing cost and to minimize the total processing time for semiconductor chips.

The advent of finFETs, i.e., field effect transistors formed on semiconductor fins having a height greater than the width, alters the processing steps of conventional planar field effect transistors significantly. For example, semiconductor fins are formed by patterning a top semiconductor layer of a semiconductor-on-insulator (SOI) substrate. Thus, the conventional planar capacitor that employs an upper portion of a semiconductor substrate as a lower plate cannot be formed on a substrate including finFETs.

BRIEF SUMMARY

At least one semiconductor fin for a capacitor is formed concurrently with other semiconductor fins for field effect transistors. A lower conductive layer is deposited and lithographically patterned to form a lower conductive plate located on the at least one semiconductor fin. A dielectric layer and at least one upper conductive layer are formed and lithographically patterned to form a node dielectric and an upper conductive plate over the lower conductive plate as well as a gate dielectric and a gate conductor over the other semiconductor fins. The lower conductive plate, the node dielectric, and the upper conductive plate collectively form a capacitor. The finFETs may be dual gate finFETs or trigate finFETs. A buried insulator layer may be optionally recessed to increase the capacitance. Alternately, the lower conductive plate may be formed on a planar surface of the buried insulator layer.

According to an aspect of the present invention, a structure is provided, which includes: at least one fin structure located on a insulator material layer of a substrate; a lower conductive plate contacting a surface of the insulator material layer; a node dielectric contacting the lower conductive plate; an upper conductive plate contacting the node dielectric; and a gate dielectric contacting sidewalls of the at least one fin structure and having a same composition as the node dielectric.

According to another aspect of the present invention, a method of forming a structure is provided. The method includes: forming at least one fin structure on an insulator material layer of a substrate; forming a lower conductive plate contacting a surface of the insulator material layer; forming a node dielectric directly on the lower conductive plate and a gate dielectric directly on sidewalls of the at least one fin structure, wherein the node dielectric and the gate dielectric are formed by patterning a same dielectric layer; and forming an upper conductive plate directly on the node dielectric.

DETAILED DESCRIPTION

Figure 1A:
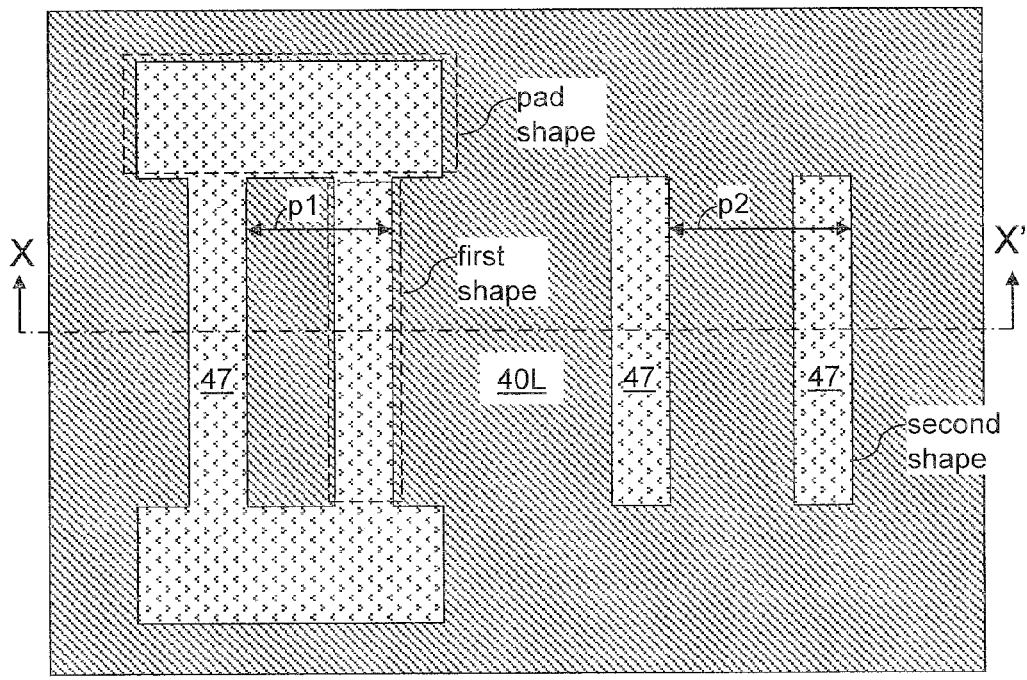
FIG. 1A is a top-down view of a first exemplary semiconductor structure after patterning of a first masking layer according to a first embodiment of the present invention.

As stated above, the present invention relates to a semiconductor structure including a metal-insulator-metal capacitor (MIMCAP) compatible with finFET structures, and methods of manufacturing the same, which are now described in detail with accompanying figures. It is noted that like and corresponding elements are referred to by like reference numerals. The drawings are not in scale.

Figure 1B:
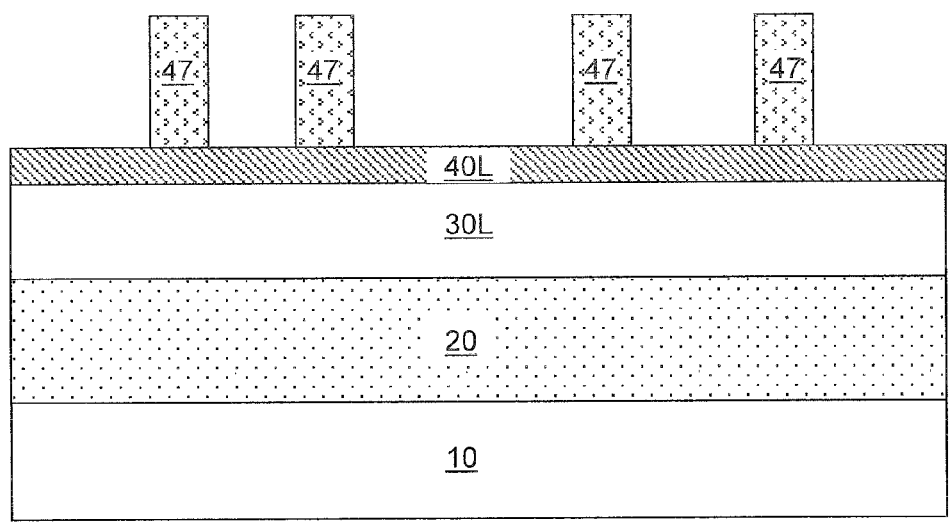
FIG. 1B is a vertical cross-sectional view of the first exemplary semiconductor structure along the plane X-X' in FIG. 1A according to the first embodiment of the present invention.

Referring to FIGS. 1A and 1B, a first exemplary semiconductor structure according to a first embodiment of the present invention includes a substrate containing a vertical stack of a handle substrate 10, an insulator material layer 20, and a top semiconductor layer 30L. The handle substrate 10 may include a semiconductor material, an insulator material, a conductive material, or a combination thereof. The handle substrate 10 can provide mechanical support for the insulator material layer 20 and the top semiconductor layer 30L.

The insulator material layer 20 includes an insulator material such as silicon oxide, silicon nitride, silicon oxynitride, or a combination thereof. The insulator material layer 20 provides electrical isolation between the top semiconductor layer 30L and the handle substrate 10. The thickness of the insulator material layer 20 can be from 30 nm to 2 microns, and typically from 50 nm to 500 nm, although lesser and greater thicknesses can also be employed.

The top semiconductor layer 30L includes a semiconductor material, which may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Preferably, the top semiconductor layer 30L includes a single crystalline material having an epitaxial atomic alignment throughout. The thickness of the top semiconductor layer 30L can be from 50 nm to 500 nm, although lesser and greater thicknesses can also be employed.

A fin cap dielectric layer 40L is deposited on the top surface of the top semiconductor layer 30L, for example, by chemical vapor deposition (CVD). The fin cap dielectric layer 40L includes a dielectric material such as silicon oxide, silicon nitride, silicon oxynitride, or a combination thereof. The thickness of the fin cap dielectric layer 40L can be from 30 nm to 120 nm, although lesser and greater thicknesses can also be employed.

A first masking layer 47 is formed on the top surface of the fin cap dielectric layer 40L and is lithographically patterned. In one embodiment, the first masking layer 47 can be a photoresist layer that can be directly patterned by lithographic exposure and development.

The pattern in the first masking layer 47 includes at least one first shape having two parallel edges and at least one second shape having two parallel edges. The at least one first shape may be a plurality of first shapes, and/or the at least one second shape may be a plurality of second shapes. Each of the at least one first shape is rectangular, and may have a periodicity at a first pitch p1 in a direction perpendicular to the parallel edges of the first shape(s). Each of the at least one second shape is rectangular, and may have a periodicity at a second pitch p2 in a direction perpendicular to the parallel edges of the second shape(s). thereby said pattern is made of the same width throughout.

In case the at least one first shapes is a plurality of first shapes, the ends of the first shapes may be connected to at least one pad shape. Each pad shape laterally abuts a plurality of first shapes. Two pad shapes may be provided so that all of the first shapes are laterally abutted by one of the two pad shapes at each lengthwise end. Thus, a combined shape formed in the first masking layer 47 may include two pad shapes interconnected by a plurality of rectangular first shapes having parallel edges and having a first pitch p1. Alternately, a combined shape in the first masking layer 47 may include two pad shapes interconnected by a single rectangular shape.

At the same time, the at least one second shape is patterned to correspond to horizontal cross-sectional area(s) of at least one semiconductor fin, which can be employed to form at least one finFET. In case a plurality of second shapes is formed in an array configuration with a second pitch p2, the second pitch p2 may be limited by the requirement that dielectric spacers to be subsequently formed do not plug the space between adjacent semiconductor fins. However, a plurality of first fins having a first pitch p1 is not limited by this constraint. Thus, the first pitch p1 may be a lithographically printable minimum pitch, and may be smaller than the second pitch p2.

Figure 2A:
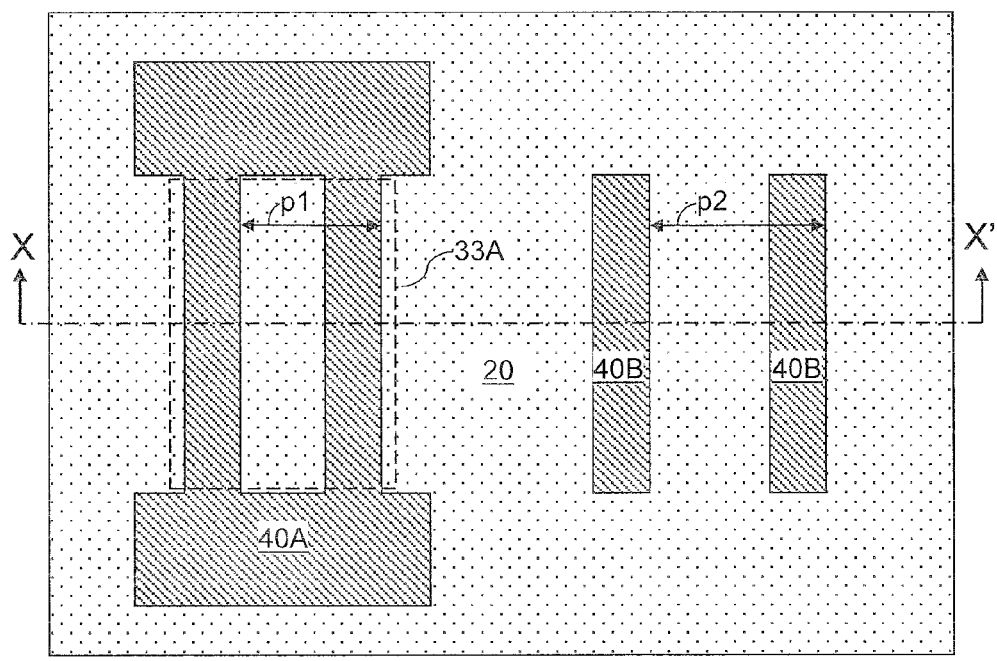
FIG. 2A is a top-down view of the first exemplary semiconductor structure after patterning of semiconductor fins according to the first embodiment of the present invention.
Figure 2B:
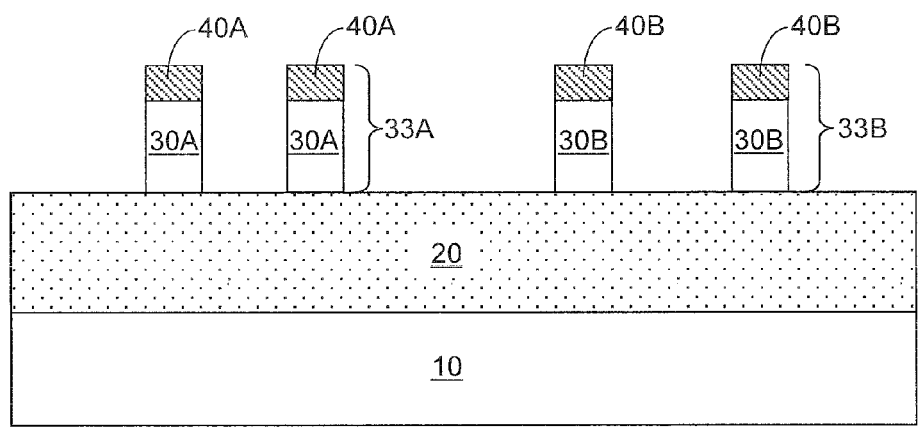
FIG. 2B is a vertical cross-sectional view of the first exemplary semiconductor structure along the plane X-X' in FIG. 2A according to the first embodiment of the present invention.

Referring to FIGS. 2A and 2B, semiconductor fins are patterned by transferring the pattern in the first masking layer 47 into the fin cap dielectric layer 40L and the top semiconductor layer 30L. The remaining portions of the fin cap dielectric layer 40L within the at least one first shape and any contiguous pad shape constitute at least one first fin cap dielectric portion 40A. The remaining portions of the top semiconductor layer 30L within the at least one first shape and any contiguous pad shape constitute at least one first semiconductor material portion 30A. A vertical stack of a first semiconductor material portion 30A and a first fin cap dielectric portion 40A constitute a fin assembly structure (30A, 40A) that has a horizontal cross-sectional area of the combined shape.

The fin assembly structure (30A, 40A) include at least one first fin structure 33A, which is at least one portion that correspond to the at least one rectangular first shape, i.e., the complement of the pad portions of the fin assembly structure (30A, 40A). Each of the at least one first fin structure 33A has a pair of sidewalls that vertically extend from a top surface of a rectangular portion of a first fin cap dielectric portion 40A to a bottom surface of a rectangular portion of a first semiconductor material portion. In case the at least one first fin structure 33A is a plurality of fin structures, the individual first fin structures 33A may be arranged in an array with the first pitch p1.

The remaining portions of the fin cap dielectric layer 40L within the at least one second shape constitute at least one second fin cap dielectric portion 40B. The remaining portions of the top semiconductor layer 30L within the at least one second shape constitute at least one second semiconductor material portion 30B. A vertical stack of a second semiconductor material portion 30B and a second fin cap dielectric portion 40B constitute a second fin structure 33B that has a horizontal cross-sectional area of a second shape.

The width of each second fin structure 33B is selected to optimize the performance of a finFET to be subsequently formed thereupon. Likewise, the height of the second semiconductor material portion 303 (and consequently, the thickness of the top semiconductor layer 30L in FIGS. 1A and 1B) can be selected to optimize the performance of the finFET(s) to be formed from the at least one second fin structure 33B. The width of the at least one first fin structure 33A is not constrained by performance limitations of any finFET, but is limited only by the lithographic capacity to print a narrow structure and the mechanical stability of the at least one first fin structure 33A. Consequently, the width of the at least one first fin structure 33A can be less than the width of the at least one second fin structure 33B. The height of the at least one first fin structure 33A is the same as the height of the at least one second fin structure 33B.

Figure 3A:
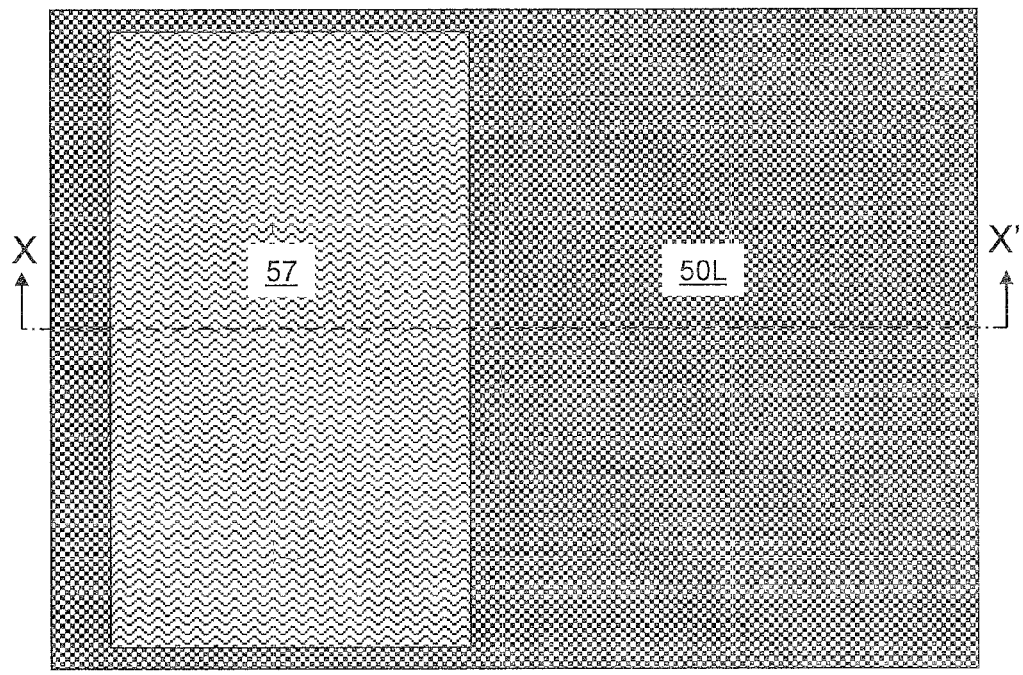
FIG. 3A is a top-down view of the first exemplary semiconductor structure after deposition of a lower conductive layer and lithographic patterning of a second masking layer according to the first embodiment of the present invention.
Figure 3B:
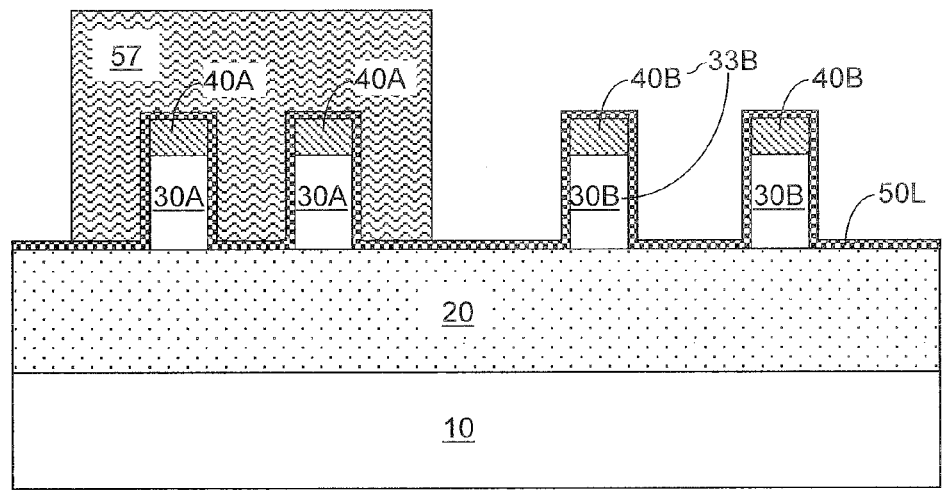
FIG. 3B is a vertical cross-sectional view of the first exemplary semiconductor structure along the plane X-X' in FIG. 3A according to the first embodiment of the present invention.

Referring to FIGS. 3A and 3B, a lower conductive layer 50L is deposited on the exposed surfaces of the insulator material layer 20 and the sidewalls and the top surfaces of the fin assembly structure (30A, 40A) and the at least one second fin structure 33B. The lower conductive layer 50L includes a metallic conductive material, which can be, but is not limited to, TiN, TaN, WN, TiAlN, TaCN, CoWP, Ti, Ta, W, or a combination thereof. The lower conductive layer 50L can be deposited, for example, by chemical vapor deposition, physical vapor deposition (sputtering), electroplating, or a combination thereof. The lower conductive layer 50L can be a conformal layer or a non-conformal layer, i.e., may have a uniform thickness across the horizontal portions and the vertical portions or may have different thicknesses. The thickness of the lower conductive layer 50L as measured at horizontal portions can be from 0.4 nm to 30 nm, and typically from 0.5 nm to 10 nm, although lesser and greater thicknesses can also be employed.

A second masking layer 57 is formed over the lower conductive layer 50L and is lithographically patterned. In one embodiment, the second masking layer 57 can be a photoresist layer that can be directly patterned by lithographic exposure and development. After lithographic patterning, the second masking layer 57 covers the entirety of the area of the fin assembly structure (30A, 40A).

Figure 4A:
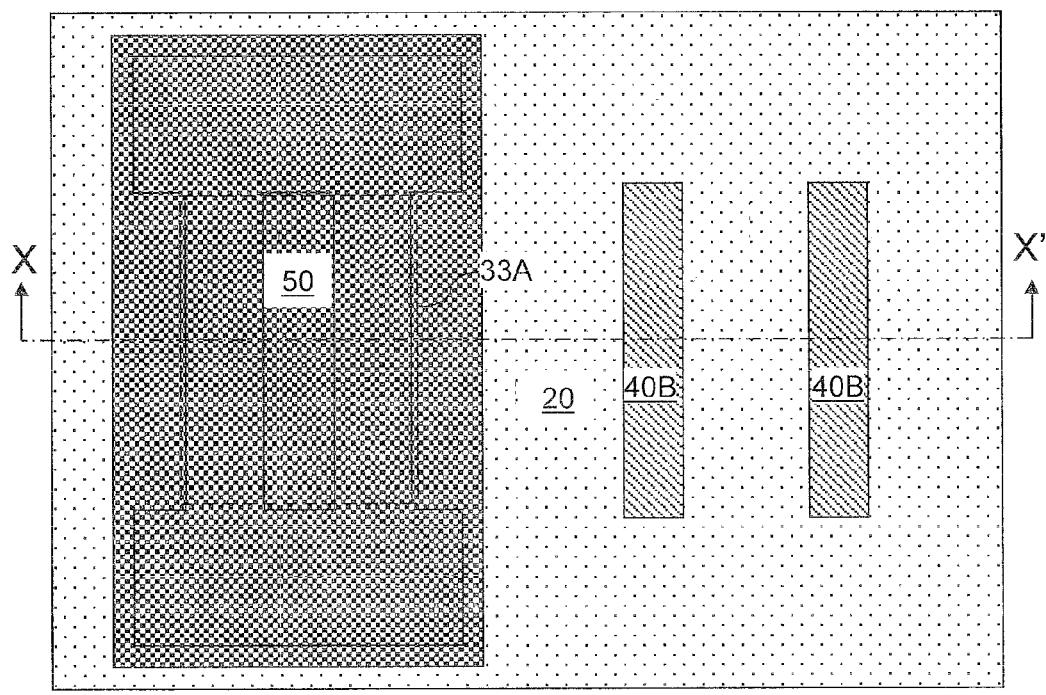
FIG. 4A is a top-down view of the first exemplary semiconductor structure after formation of a lower conductive plate according to the first embodiment of the present invention.
Figure 4B:
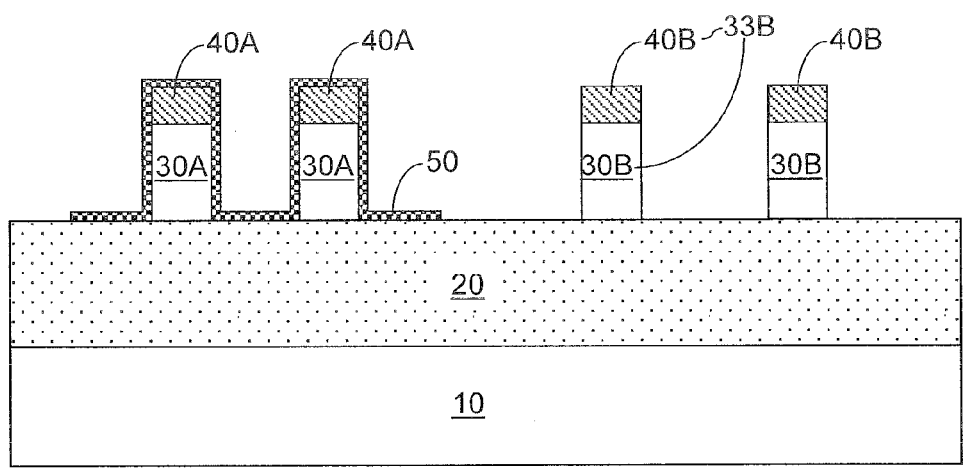
FIG. 4B is a vertical cross-sectional view of the first exemplary semiconductor structure along the plane X-X' in FIG. 4A according to the first embodiment of the present invention.

Referring to FIGS. 4A and 4B, the pattern in the second masking layer 57 is transferred to the lower conductive layer 50L by an etch, which can be an isotropic etch such as a wet etch or an isotropic dry etch. The exposed portions of the lower conductive layer 50L are removed during the etch. The semiconductor sidewalls of the at least one second semiconductor material portion 30B are exposed after the etch. The remaining portion of the lower conductive layer 50L constitute a lower conductive plate 50, which is a contiguous structure that contacts all sidewalls of the at least one first fin structure 33A. The second masking layer 57 is subsequently removed selective to the lower conductive plate 50, for example, by asking.

Figure 5A:
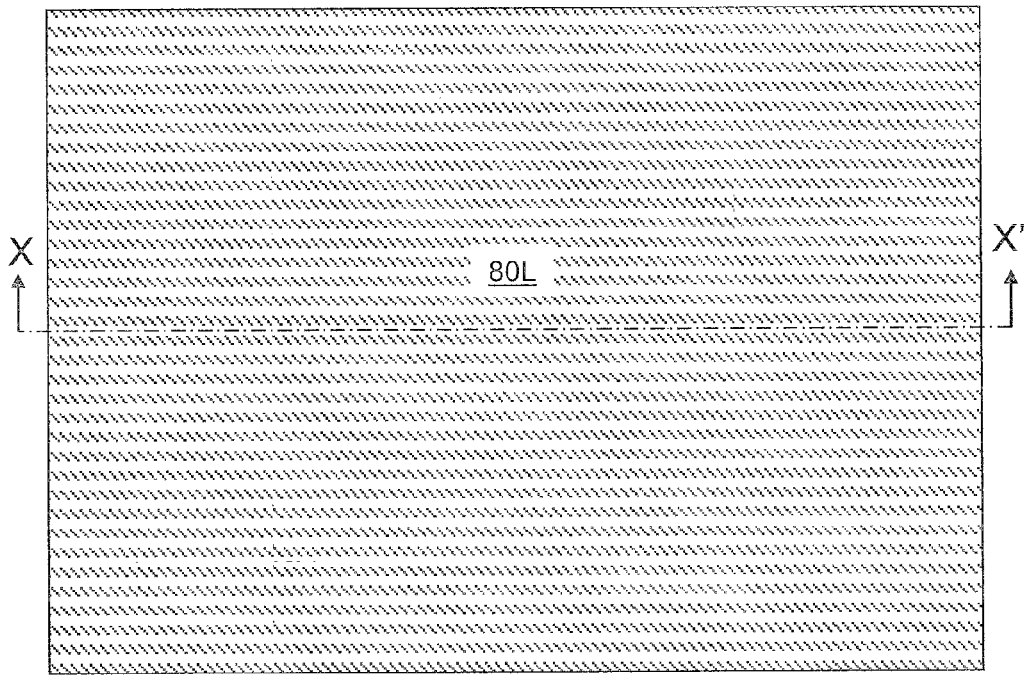
FIG. 5A is a top-down view of the first exemplary semiconductor structure after deposition of a dielectric layer and at least one upper conductive layer according to the first embodiment of the present invention.
Figure 5B:
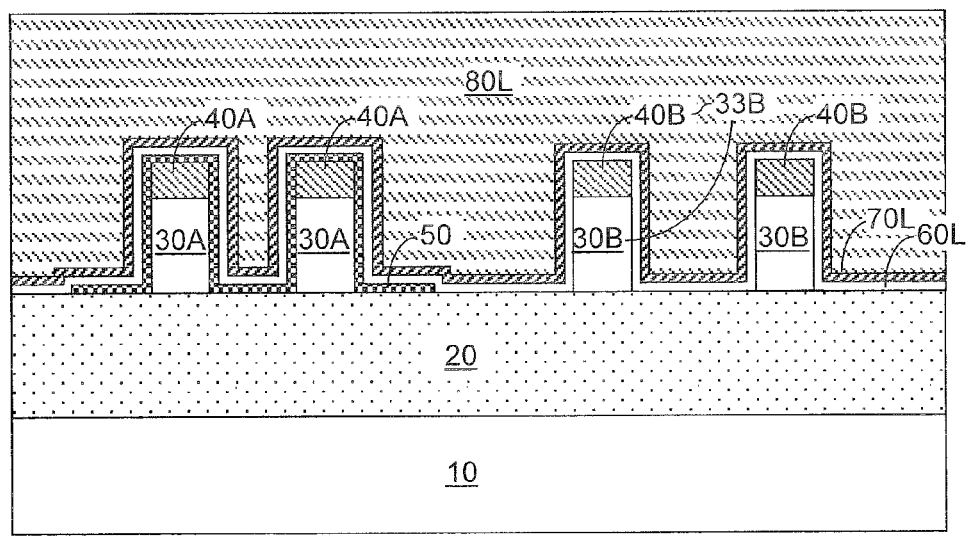
FIG. 5B is a vertical cross-sectional view of the first exemplary semiconductor structure along the plane X-X' in FIG. 5A according to the first embodiment of the present invention.

Referring to FIGS. 5A and 5B, a dielectric layer 60L and at least one upper conductive layer are deposited sequentially on the lower conductive plate 50 and the insulator material layer 20. For example, the at least one upper conductive layer may be a stack of a metallic conductive layer 70L and a doped semiconductor material layer 80L.

In one embodiment, the dielectric layer 60L includes a metal-oxide-containing dielectric material, which is commonly referred to as a high dielectric constant (high-k) material. The metal-oxide-containing dielectric material can include, for example, at least one of $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof, and non-stoichiometric variants thereof, wherein each value of x is independently from about 0.5 to about 3 and each value of y is independently from 0 to about 2. The thickness of the metal-oxide-containing insulator material can be from about 1 nm to about 10 nm, and preferably from about 1.5 nm to about 3 nm. The metal-oxide-containing insulator material can have an effective oxide thickness (BOT) on the order of, or less than, 1 nm. The metal-oxide-containing insulator material can be deposited, for example, by chemical vapor deposition, atomic layer deposition, or a combination thereof.

In another embodiment, the dielectric layer 60L includes silicon oxide, silicon nitride, silicon oxynitride, or a combination thereof. The dielectric layer 60L can be formed by deposition of a dielectric material, for example, by chemical vapor deposition.

The at least one upper conductive layer is subsequently deposited on the dielectric layer 60L. In case the at least one upper conductive layer includes a stack of the metallic conductive layer 70L and the doped semiconductor material layer SOL, the metallic conductive layer 70L can include at least one of TiN, TaN, WN, TiAlN, TaCN, CoWP, Ti, Ta, W, other conductive refractory metal nitride, or an alloy or a stack thereof. Alternately or additionally, the metallic conductive layer 70L can include a metal such as Ru, Pd, Pt, Co, Ni, $Ta_xAl_yN$, $W_xC_yN$, Zr, Hf, Al, a metal carbide, a conductive metal oxide, a conductive metal nitride, a transition metal aluminide, a metal silicide, and a combination thereof. Each value of x is independently from 0 to about 1 and each value of y is independently from 0 to about 1. Exemplary transition metal aluminide include $Ti_3Al$ and ZrAl. The metallic conductive layer 70L can be formed by chemical vapor deposition (CVD), physical vapor deposition (PVD), atomic layer deposition (ALD), or a combination thereof. The thickness of the metallic conductive layer 70L can be from about 5 nm to about 40 nm, and preferably from about 10 nm to about 30 nm, although lesser and greater thicknesses can also be employed. The composition of the metallic conductive layer 70L can be selected to optimize threshold voltages of finFETs to be subsequently formed on the at least one second fin structure 33B.

The doped semiconductor material layer SOL can include an amorphous or polycrystalline semiconductor material such as polysilicon, amorphous silicon, a silicon-germanium alloy, a silicon-carbon alloy, a silicon-germanium-carbon alloy, or a combination thereof. P-type dopant atoms or n-type dopant atoms can be introduced into the doped semiconductor material layer 80L by in-situ doping during deposition of the doped semiconductor material layer SOL, or by a subsequent ion implantation. The thickness of the doped semiconductor material layer 80L, as measured at an area laterally spaced sufficiently from the at least one first and second fin structures (33A, 33B), can be from about 30 nm to about 300 nm, and typically from about 60 nm to about 150 nm, although lesser and greater thicknesses are also contemplated herein. The doped semiconductor material layer SOL can be formed by a blanket deposition process such as chemical vapor deposition, physical vapor deposition, or a combination thereof.

Figure 6A:
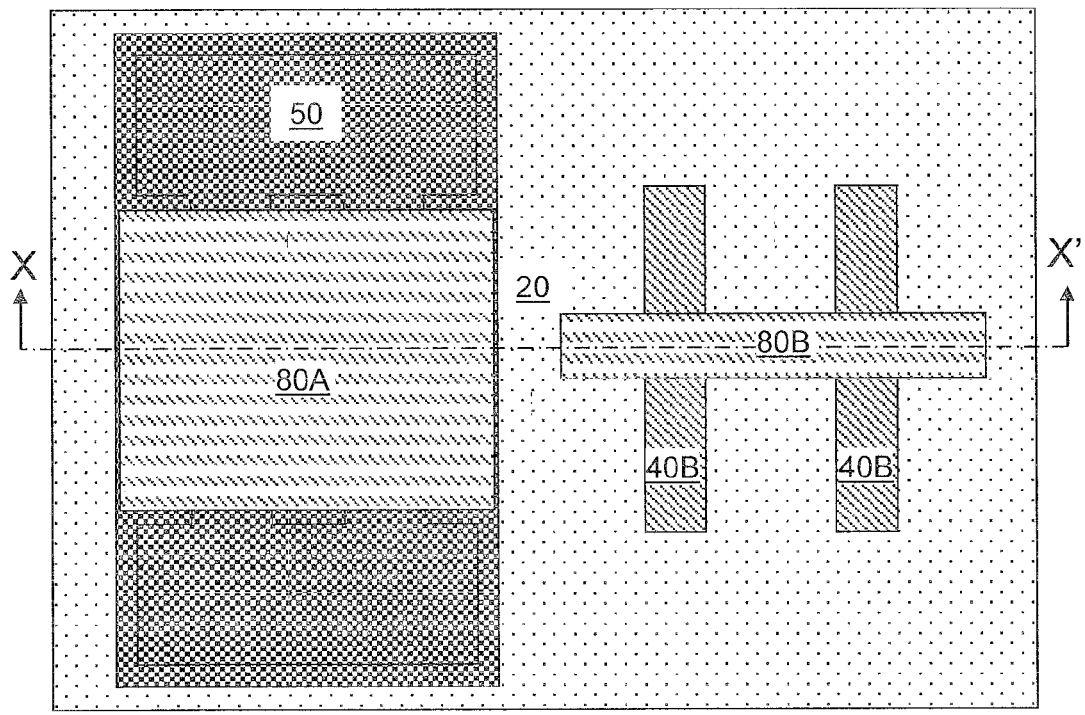
FIG. 6A is a top-down view of the first exemplary semiconductor structure after patterning of a node dielectric and an upper conductive plate and a gate conductor according to the first embodiment of the present invention.
Figure 6B:
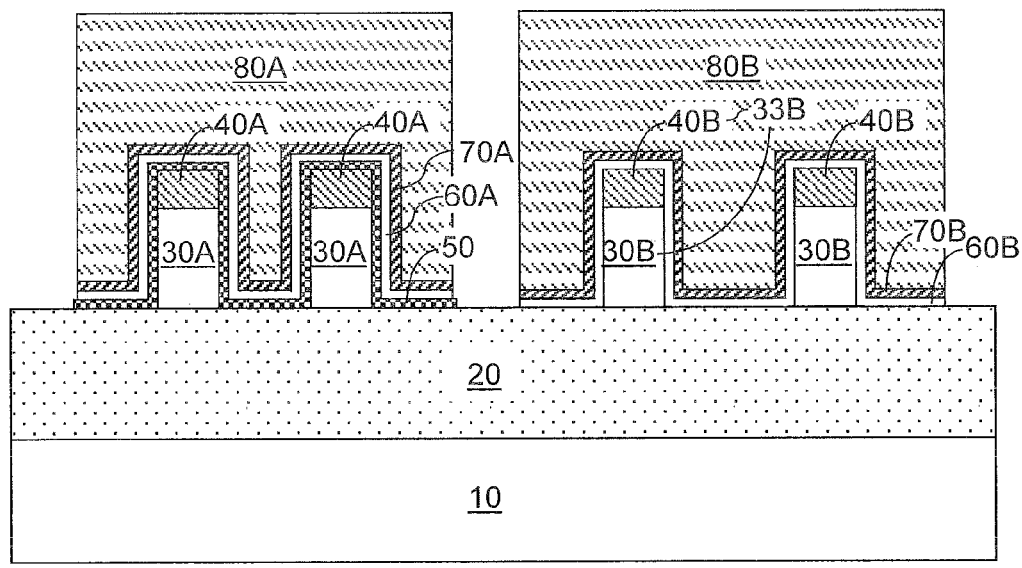
FIG. 6B is a vertical cross-sectional view of the first exemplary semiconductor structure along the plane X-X' in FIG. 6A according to the first embodiment of the present invention.

Referring to FIGS. 6A and 6B, the at least one upper conductive layer (70L, 80L) and the dielectric layer 60L are lithographically patterned. The at least one upper conductive layer (70L, 80L) can be patterned to form an upper conductive plate that overlies the at least one first fin structure of the fin assembly structure (30A, 40A). The upper conductive plate can include a stack of a first doped semiconductor material portion 80A and a first metallic conductive portion 70A. Further, the dielectric layer 60L can be patterned to form a node dielectric 60A over the at least one first fin structure of the fin assembly structure (30A, 40A). The sidewalls of the upper conductive plate (70A, 80A) vertically coincide with the sidewalls of the node dielectric 60A. The lower conductive plate 50, the node dielectric 60A, and the upper conductive plate (70A, 80A) form a capacitor.

Further, the at least one upper conductive layer (70L, 80L) can be patterned to form a gate electrode that straddles over a middle portion of the at least one second fin structure 33B. The gate electrode can include a stack of a second doped semiconductor material portion 80B and a second metallic conductive portion 70B. Further, the dielectric layer 60L can be patterned to form a gate dielectric 60B over the middle portion of the at least one second fin structure 33B. The upper conductive plate (70A, 80A) and the gate electrode (70B, 80B) can be patterned simultaneously in a first processing step, i.e., a first etch step, and the node dielectric 60A and the gate dielectric 60B can be patterned simultaneously whereby the node dielectric 60A and gate dielectric 60B comprise the same conductive material.

Figure 7A:
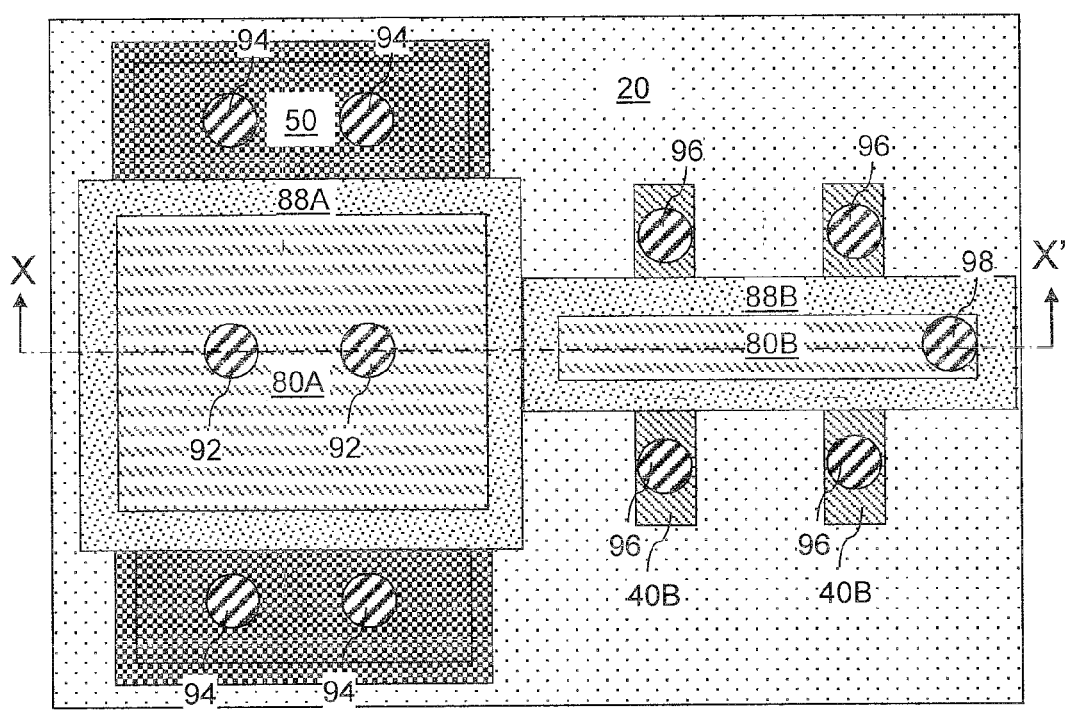
FIG. 7A is a top-down view of the first exemplary semiconductor structure after deposition of a MOL dielectric layer and formation of contact via structures according to the first embodiment of the present invention. The MOL dielectric layer is omitted from the view for clarity.
Figure 7B:
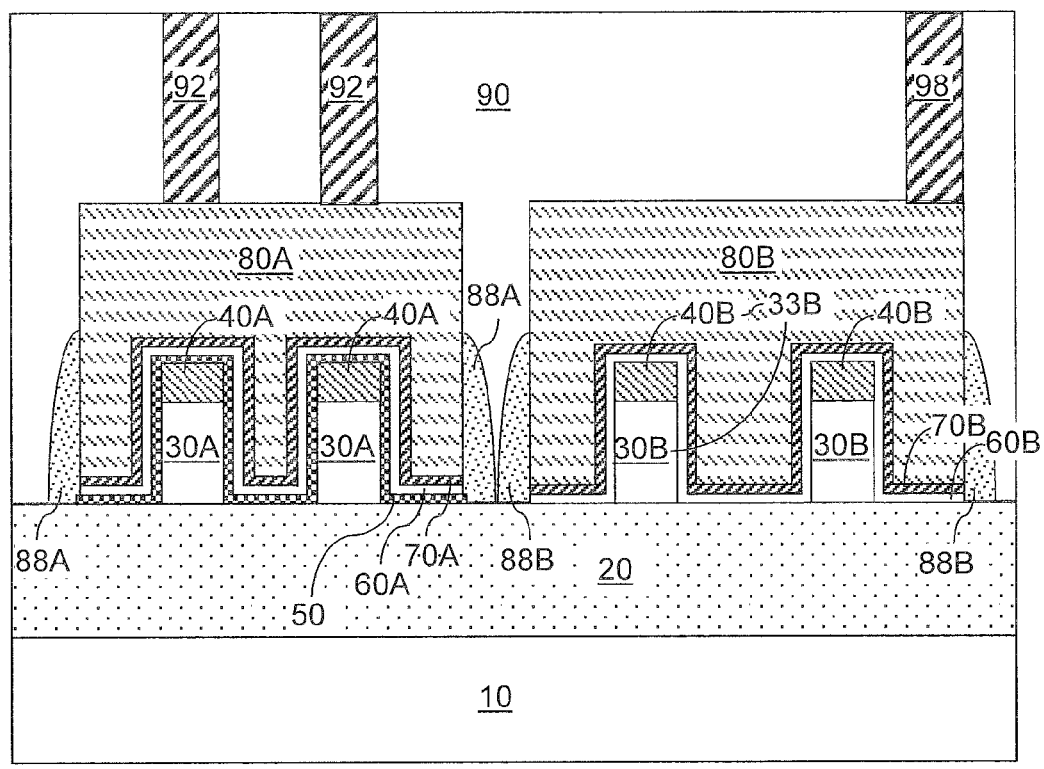
FIG. 7B is a vertical cross-sectional view of the first exemplary semiconductor structure along the plane X-X" in FIG. 7A according to the first embodiment of the present invention. The MOL dielectric layer is shown.

Referring to FIGS. 7A and 7B, masked ion implantations can be performed to dope various portions of the second semiconductor material portion 30B in each of the at least one second fin structure 33B. Further, dielectric spacers can be formed to offset the boundary of various implanted regions relative to other structural elements. For example, a second dielectric spacer 88B can be formed on the sidewalk of the gate electrode (70B, 80B) to laterally offset the boundary of source and drain regions in the at least one second semiconductor material portions 30B. A first dielectric spacer 88A can be formed around the periphery of the stack of the upper conductive plate (70A, 80A) and the node dielectric 60A concurrently with the formation of the second dielectric spacer 88B. The combination of dielectric spacers and masked ion implantations can be employed to form source and drain regions and/or source and drain extension regions in locations selected for optimized performance of finFETs that are formed on the at least one second fin structure 33B. The finFETs are dual gate FETs, i.e., field effect transistors having a gate electrode on both sidewalls of a semiconductor fin. Metal semiconductor alloys (not shown) such as a metal silicide may be formed on some semiconductor surfaces as needed.

A middle-of-line (MOL) dielectric layer 90 is deposited the upper conductive plate (70A, 80A), the gate electrode (70B, 80B), the first and second dielectric spacers (88A, 88B), and the insulator material layer 20. The MOL dielectric layer 90 is omitted from the top-down view of FIG. 7A for clarity. The MOL dielectric layer 90 may include, for example, a CVD oxide. The CVD oxide may be an undoped silicate glass (USG), borosilicate glass (BSG), phosphosilicate glass (PSG), fluorosilicate glass (FSG), borophosphosilicate glass (BPSG), or a combination thereof. Alternately or additionally, the MOL dielectric layer 90 may include an organosilicate glass (OSG). The thickness of the MOL dielectric layer 90 can be from about 200 nm to about 500 nm. The MOL dielectric layer 90 can be planarized, for example, by chemical mechanical polishing (CMP).

Various contact via holes are formed in the MOL dielectric layer 90 and filled with metal to from various contact via structures. The various contact via structures can include, but are not limited to, at least one upper terminal contact structure 92, at least one lower terminal contact structure 94, source and drain contact structures 96, and at least one gate contact structure 98. The at least one upper terminal contact structure 92 contacts the upper conductive plate (70A, 80A). The at least one lower terminal contact structure 94 contacts the lower conductive plate 50. The source and drain contact structures 96 contacts the source and drain regions of the finFET(s) formed on the at least one second fin structure 33B. The at least one gate contact structure 98 contacts the gate electrode (70B, SOB).

Figure 8A:
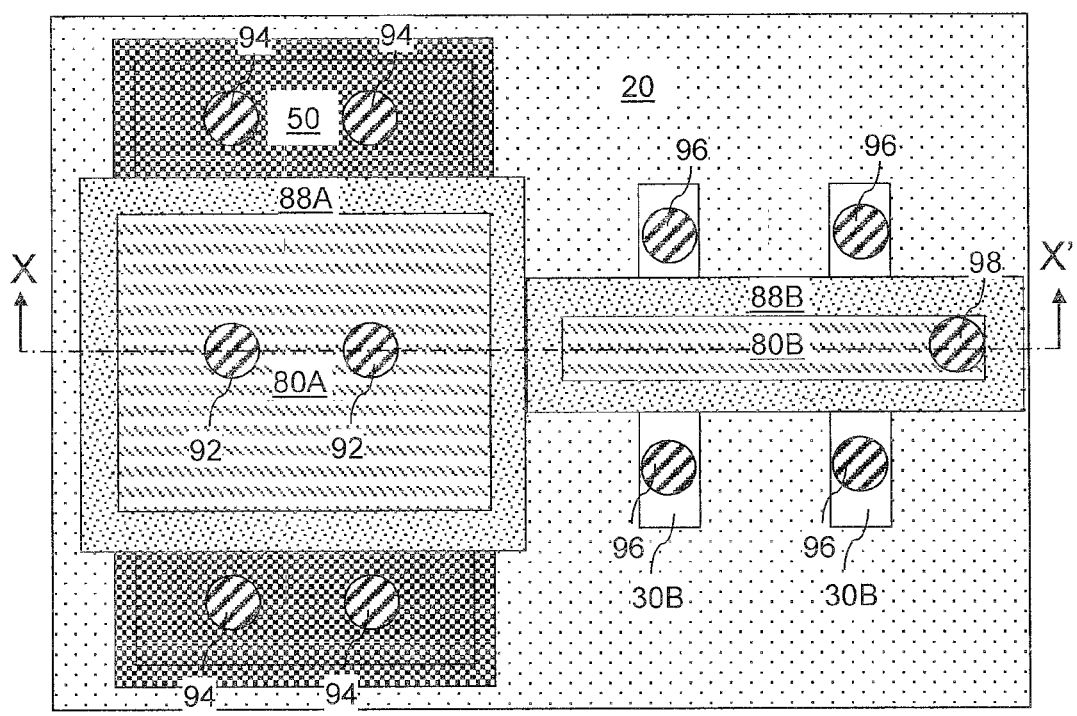
FIG. 8A is a top-down view of a second exemplary semiconductor structure after deposition of a MOL dielectric layer and formation of contact via structures according to a second embodiment of the present invention. The MOL dielectric layer is omitted from the view for clarity.
Figure 8B:
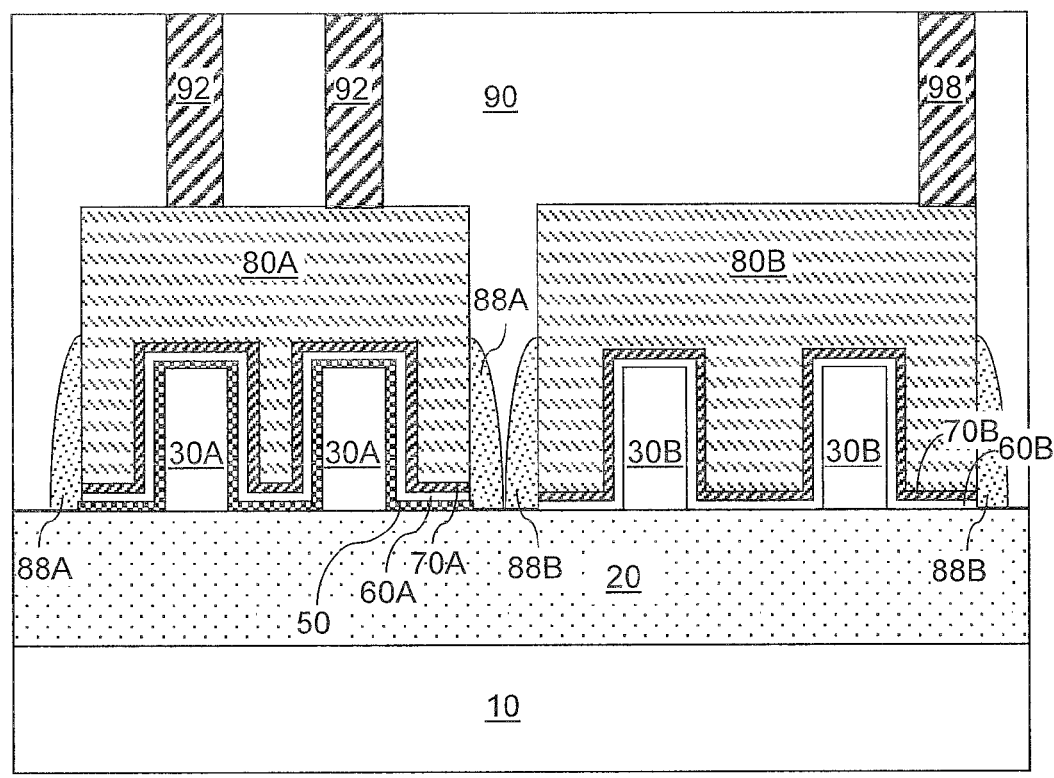
FIG. 8B is a vertical cross-sectional view of the second exemplary semiconductor structure along the plane X-X' in FIG. 8A according to the second embodiment of the present invention. The MOL dielectric layer is shown.

Referring to FIGS. 8A and 8B, a second exemplary semiconductor structure according to a second embodiment of the present invention is shown after deposition of the MOL dielectric layer 90 and formation of various contact via structures (92, 94, 96, 98). The MOL dielectric layer 90 is omitted from the top-down view of FIG. 8A for clarity. The second exemplary semiconductor structure can be derived from the first exemplary semiconductor structure by omitting the formation of the fin cap dielectric layer 40L. Correspondingly, the at least one first dielectric fin cap portion 40A and the at least one second dielectric fin cap portion 40B are not formed. Each first fin structure 33A includes a sub-portion of a first semiconductor material portion 30A, and each second fin structure 33B includes a second semiconductor material portion 30B. The top surfaces of the at least one first semiconductor material portion 30A contacts a bottom surface of the lower conductive plate 50. The top surfaces of the at least one second semiconductor material portion 30B contacts a bottom surface of the gate dielectric 60B. The finFETs are trigate FETs, i.e., field effect transistors having a gate electrode on both sidewalls of a semiconductor fin and on a top surface of the semiconductor fin.

Figure 9A:
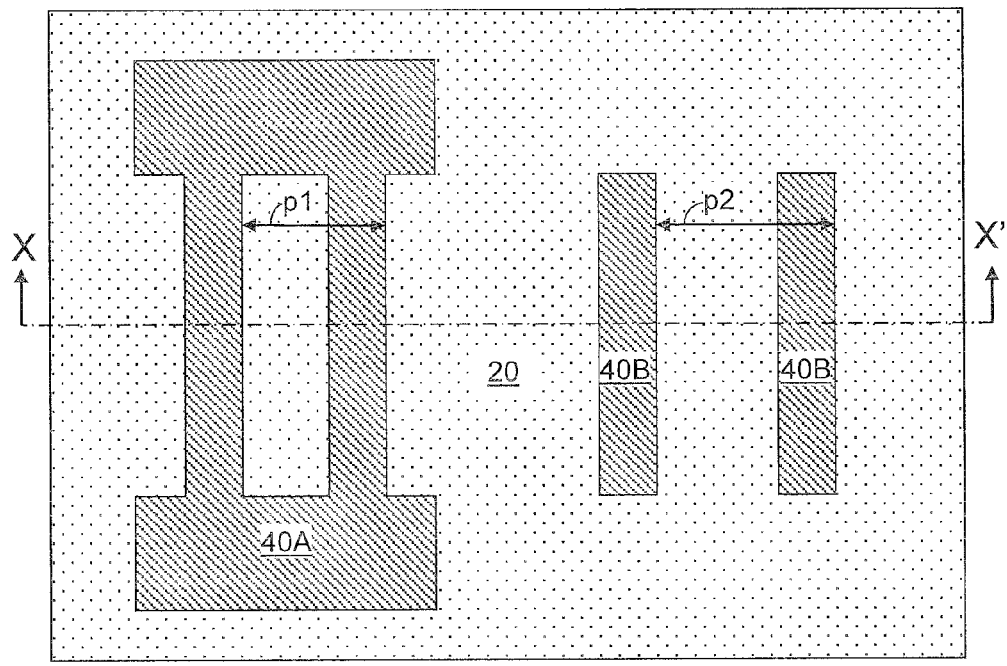
FIG. 9A is a top-down view of a third exemplary semiconductor structure after patterning of semiconductor fins according to a third embodiment of the present invention.
Figure 9B:
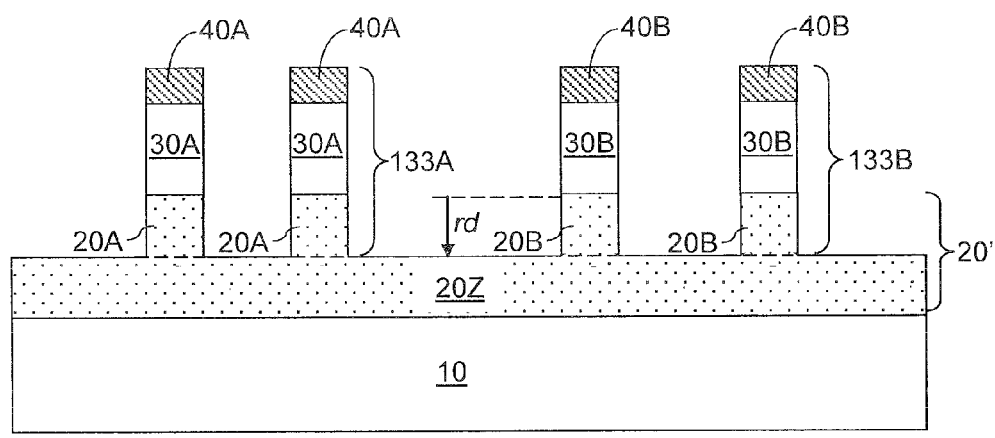
FIG. 9B is a vertical cross-sectional view of the third exemplary semiconductor structure along the plane X-X' in FIG. 9A according to the third embodiment of the present invention.

Referring to FIGS. 9A and 9B, a third exemplary semiconductor structure according to a third embodiment of the present invention is derived from the first exemplary semiconductor structure of FIGS. 1A and 1B by etching through unmasked portions of the fin cap dielectric layer 40L and the top semiconductor layer 30L and subsequently etching into upper portions of the insulator material layer 20. The insulating material layer 20 including patterned recessed areas is herein referred to as a patterned insulating material layer 20'. The first masking layer 47 is subsequently removed. The recess depth rd, which is the vertical distance between the topmost surfaces of the patterned insulating material layer 20' and the recessed surfaces of the patterned insulating material layer 20' can be from 1% to 99%, and typically from 10% to 90% of the thickness of the insulating material layer 20 prior to patterning.

The patterned insulating material layer 20' includes a planar portion, which is herein referred to as a planar insulating material layer 20Z. The patterned insulating material layer 20' further includes at least one protruding portion, which is herein referred to as at least one first insulating material portion 20A, underneath the at least one first semiconductor portion 30A. The patterned insulating material layer 20' further includes at least another protruding portion, which is herein referred to as at least one second insulating material portion 20B, underneath the at least one second semiconductor portion 30B. The sidewalls of each first insulator material portion 20A are vertically coincident with sidewalls of a first semiconductor material portion 30A and a first fin cap dielectric portion 40A. The sidewalls of each second insulator material portion 20B are vertically coincident with sidewalls of a second semiconductor material portion 30B and a second fin cap dielectric portion 40B.

In the third exemplary semiconductor structure, each of the at least one first fin structure 133A includes a rectangular portion of a vertical stack, from bottom to top, of a first insulator material portion 20A, a first semiconductor material portion 30A, and a first fin cap dielectric portion 40A. Likewise, each of the at least one second fin structure 133B includes a vertical stack, from bottom to top, of a second insulator material portion 20B, a second semiconductor material portion 30B, and a second fin cap dielectric portion 40B. The first and second fin structures (133A, 133B) have the same composition and the same height.

In a variation of the third exemplary semiconductor structure, the bottom corners of the first and second insulator material portions (20A, 20B) can be rounded, for example, by employing a polymerizing etch. Such corner rounding can be advantageously employed to reduce electric field generated from a lower conductive plate of a capacitor to be subsequently formed. In another variation of the third exemplar semiconductor structure, the first and second insulator material portions (20A, 20B) may be laterally recessed by an isotropic etch. Such lateral recessing increases the exposed area of the at least one first fin structure 133A so that a lower conductive plate of a capacitor to be subsequently formed has an increased area, thereby increasing the capacitance of the capacitor.

Figure 10A:
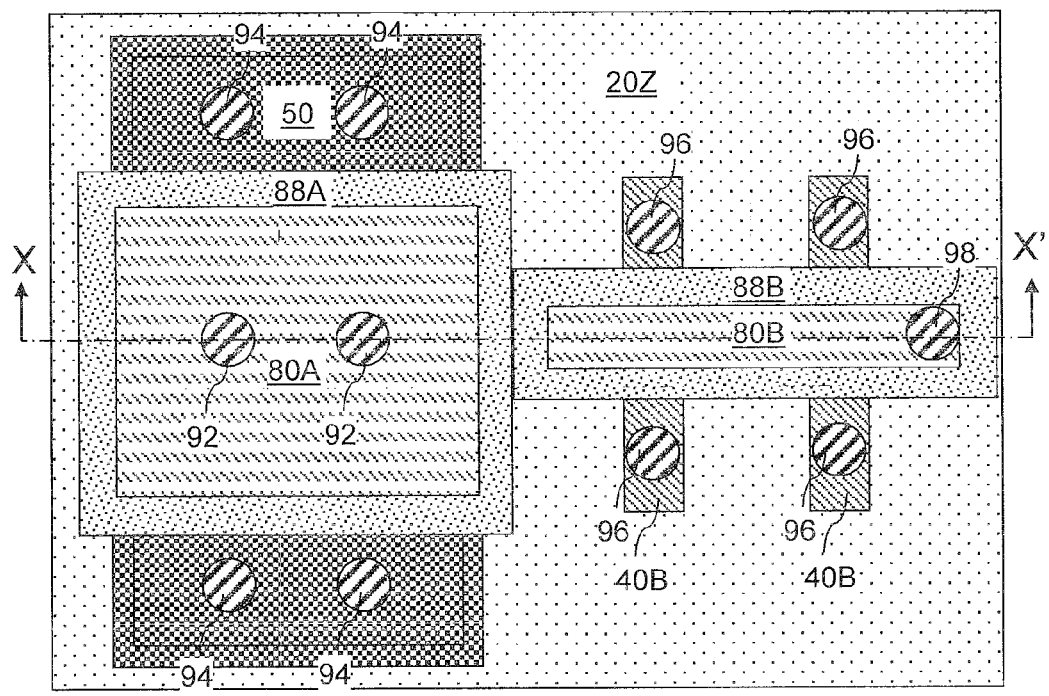
FIG. 10A is a top-down view of a third exemplary semiconductor structure after deposition of a MOL dielectric layer and formation of contact via structures according to a third embodiment of the present invention. The MOL dielectric layer is omitted from the view for clarity.
Figure 10B:
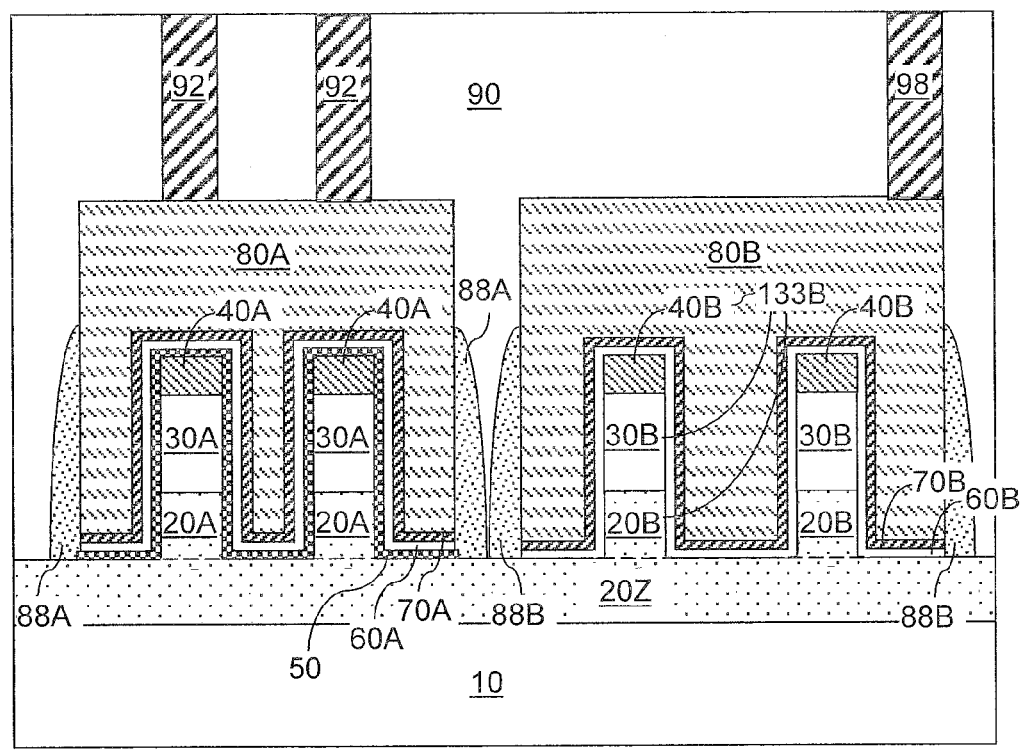
FIG. 10B is a vertical cross-sectional view of the third exemplary semiconductor structure along the plane X-X' in FIG. 10A according to the third embodiment of the present invention. The MOL dielectric layer is shown.

The processing steps of FIGS. 3A-7B can be sequentially performed to form the third exemplary semiconductor structure shown in FIGS. 10A and 10B. The MOL dielectric layer 90 is omitted from the top-down view of FIG. 10A for clarity. The third exemplary semiconductor structure can provide an increased capacitance over the first exemplary semiconductor structure by the extended height of the sidewalls of the first fin structure (20A, 30A, 40A) due to the presence of the at least one first insulator material portion 20A. The finFETs of the third exemplary semiconductor structure are dual gate FETs.

Figure 11A:
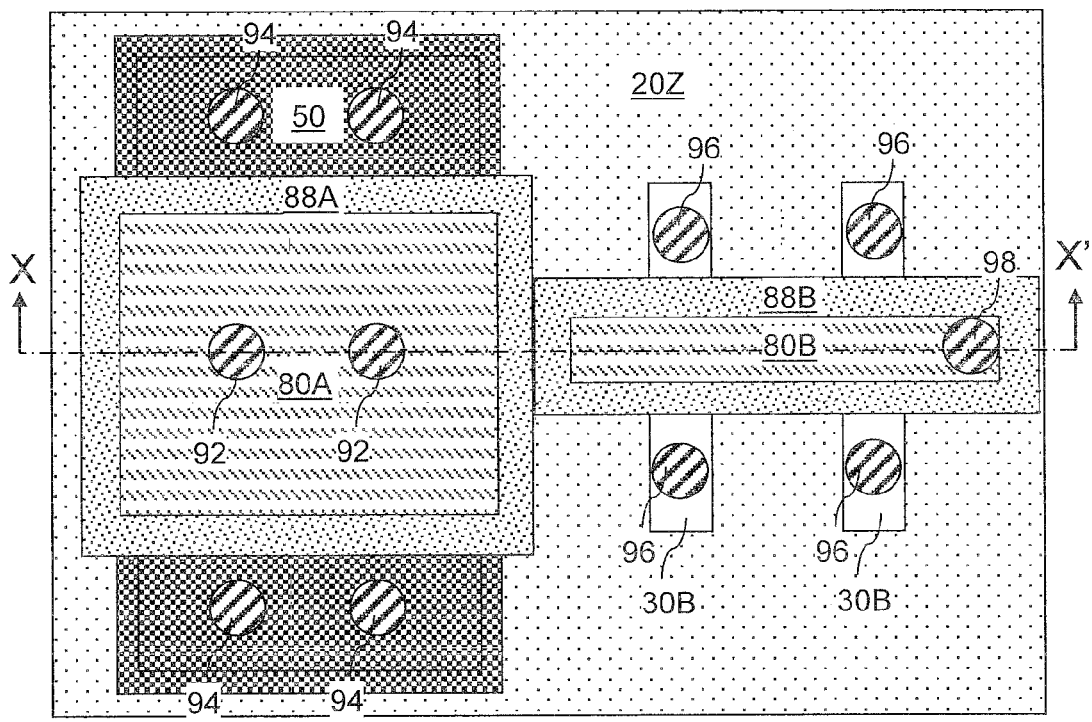
FIG. 11A is a top-down view of a fourth exemplary semiconductor structure after deposition of a MOL dielectric layer and formation of contact via structures according to a fourth embodiment of the present invention. The MOL dielectric layer is omitted from the view for clarity.
Figure 11B:
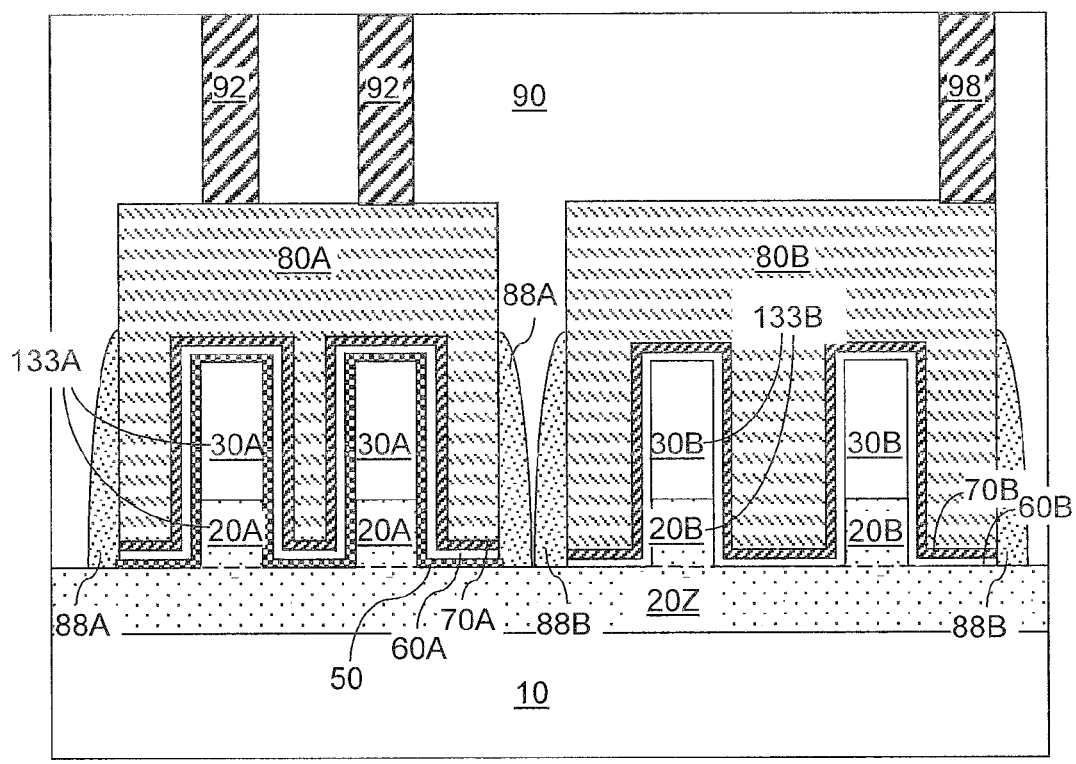
FIG. 11B is a vertical cross-sectional view of the fourth exemplary semiconductor structure along the plane X-X' in FIG. 11A according to the fourth embodiment of the present invention. The MOL dielectric layer is shown.

Referring to FIG. 11A is a top-down view of a fourth exemplary semiconductor structure according to a fourth embodiment of the present invention is shown after deposition of the MOL dielectric layer 90 and formation of various contact via structures (92, 94, 96, 98). The MOL dielectric layer 90 is omitted from the top-down view of FIG. 11A for clarity. The fourth exemplary semiconductor structure can be derived from the third exemplary semiconductor structure by omitting the formation of the fin cap dielectric layer 40L. Correspondingly, the at least one first dielectric fin cap portion 40A and the at least one second dielectric fin cap portion 40B are not formed. Each first fin structure 133A includes a portion of a stack of a first insulator material portion 20A and a first semiconductor material portion 30A, and each second fin structure 133B includes a stack of a second insulator material portion 20B and a second semiconductor material portion 30B. The top surfaces of the at least one first semiconductor material portion 30A contacts a bottom surface of the lower conductive plate 50. The top surfaces of the at least one second semiconductor material portion 30B contacts a bottom surface of the gate dielectric 60B. The finFETs are trigate FETs, i.e., field effect transistors having a gate electrode on both sidewalls of a semiconductor fin and on a top surface of the semiconductor fin.

Figure 12A:
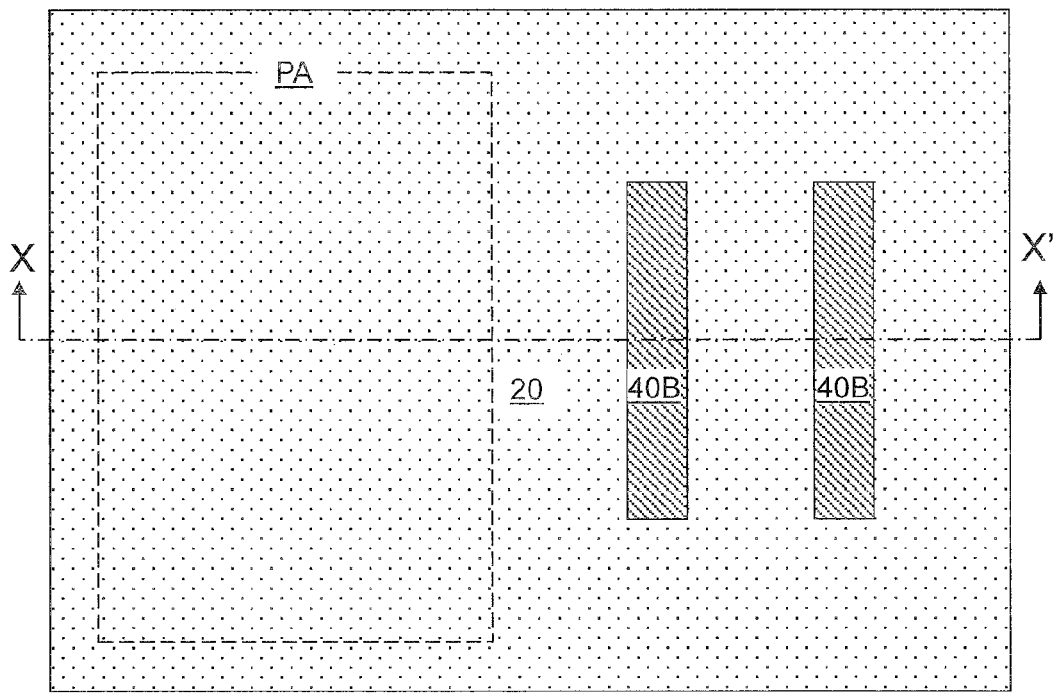
FIG. 12A is a top-down view of a fifth exemplary semiconductor structure after patterning of semiconductor fins according to the fifth embodiment of the present invention.
Figure 12B:
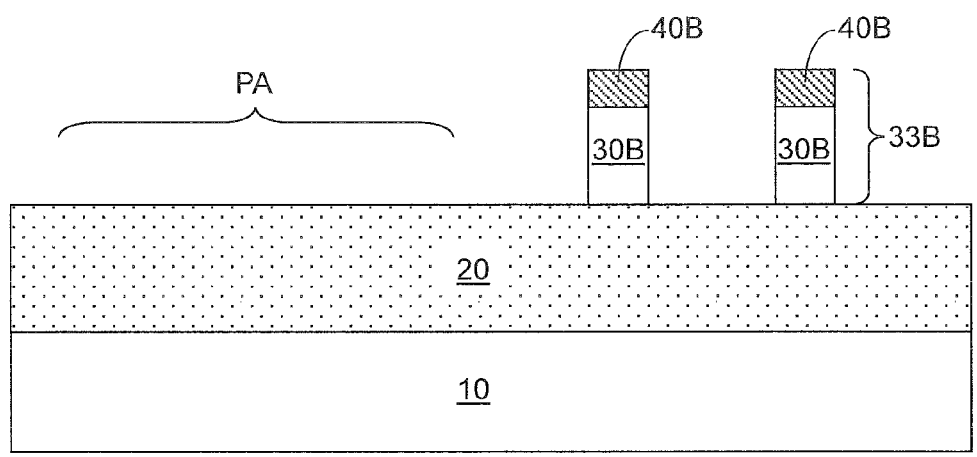
FIG. 12B is a vertical cross-sectional view of the fifth exemplary semiconductor structure along the plane X-X' in FIG. 12A according to the fifth embodiment of the present invention.

Referring to FIGS. 12A and 12B, a fifth exemplary semiconductor structure according to the fifth embodiment of the present invention can be derived from the first exemplary semiconductor structure of FIGS. 2A and 2B by eliminating the vertical stack of the first semiconductor material portion 30A and the first fin cap dielectric portion 40A. Correspondingly, the at least one first fin structure 33A is not present in the fifth exemplary semiconductor structure. An exposed planar top surface area PA of the insulator material layer 20 is provided in the fifth exemplary semiconductor structure.

Figure 13A:
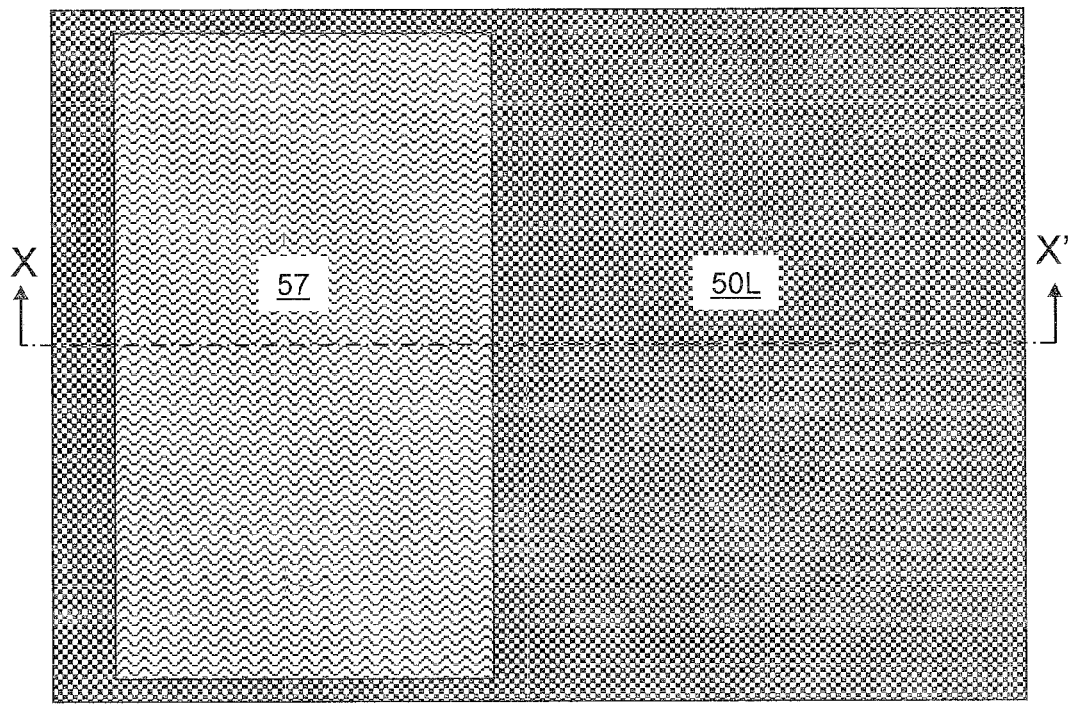
FIG. 13A is a top-down view of the fifth exemplary semiconductor structure after deposition of a lower conductive layer and lithographic patterning of a second masking layer according to the fifth embodiment of the present invention.
Figure 13B:
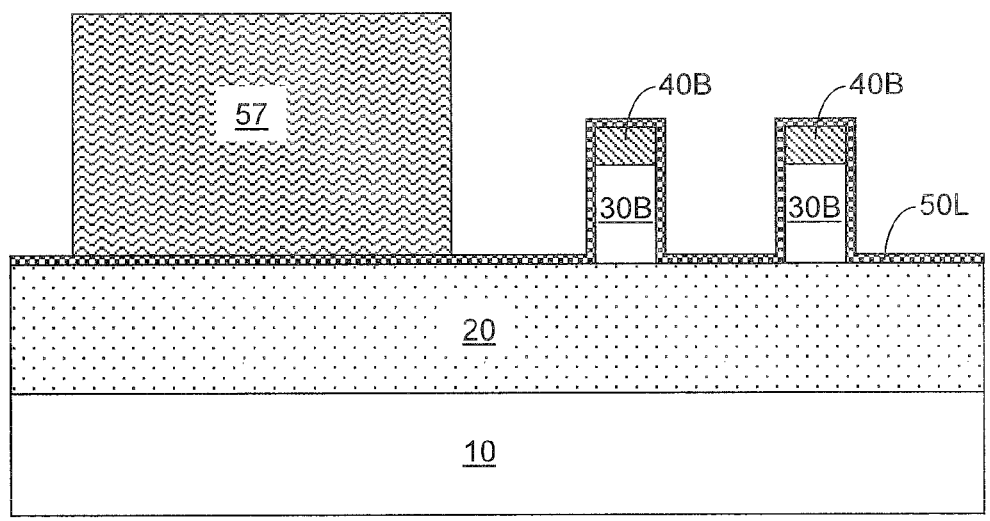
FIG. 13B is a vertical cross-sectional view of the fifth exemplary semiconductor structure along the plane X-X' in FIG. 13A according to the fifth embodiment of the present invention.

Referring to FIGS. 13A and 13B, the processing steps of FIGS. 3A and 3B can be performed as in the first embodiment. Because a first fin structure 33A of the first embodiment (See FIGS. 3A and 3B) is not present, a planar portion of the lower conductive layer 50L is formed in the exposed planar top surface area of the insulator material layer 20. A second masking layer 57 is patterned to cover the planar portion of the lower conductive layer 50L.

Figure 14A:
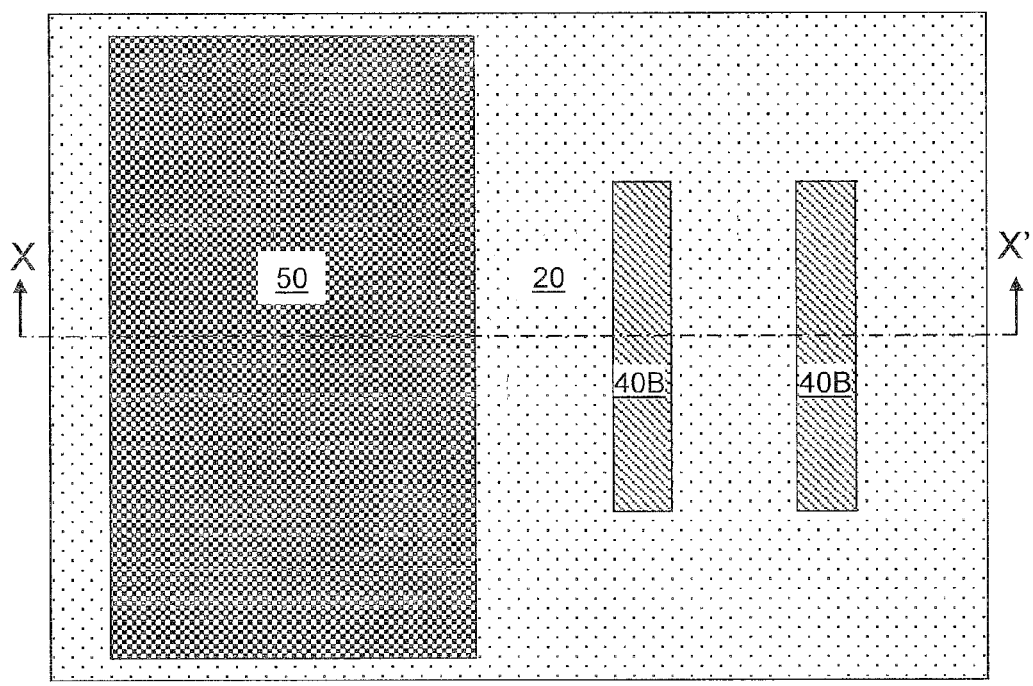
FIG. 14A is a top-down view of the fifth exemplary semiconductor structure after formation of a lower conductive plate according to the fifth embodiment of the present invention.
Figure 14B:
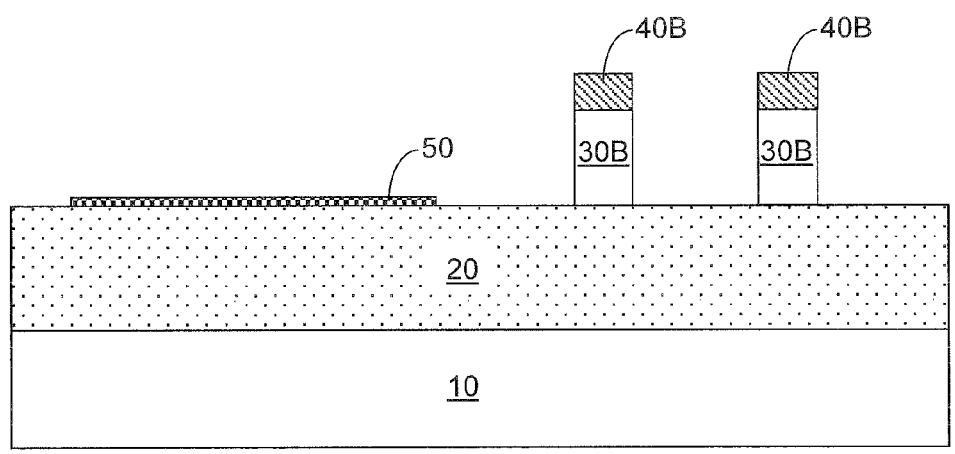
FIG. 14B is a vertical cross-sectional view of the fifth exemplary semiconductor structure along the plane X-X' in FIG. 14A according to the fifth embodiment of the present invention.

Referring to FIGS. 14A and 14B, the processing steps of FIGS. 4A and 4B can be performed as in the first embodiment. The remaining portion of the lower conductive layer 50L constitutes a lower conductive plate 50. The entirety of the bottom surface of the lower conductive plate 50 contacts a planar top surface of the insulator material layer 20.

Figure 15A:
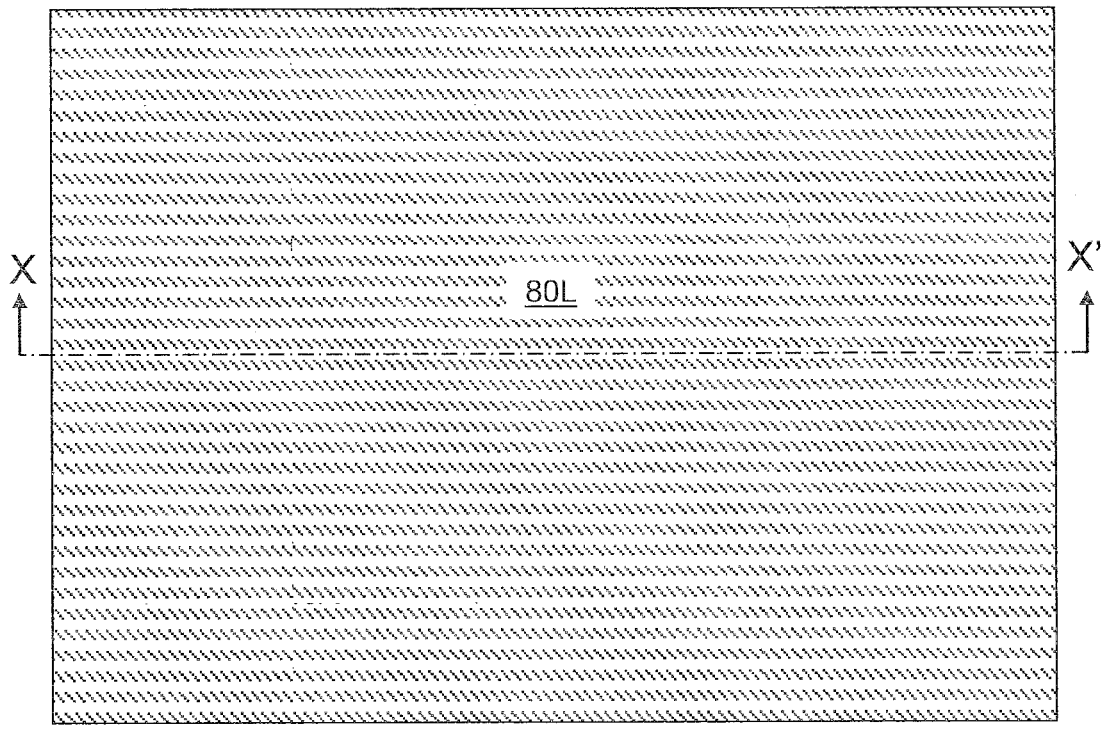
FIG. 15A is a top-down view of the fifth exemplary semiconductor structure after deposition of a dielectric layer and at least one upper conductive layer according to the fifth embodiment of the present invention.
Figure 15B:
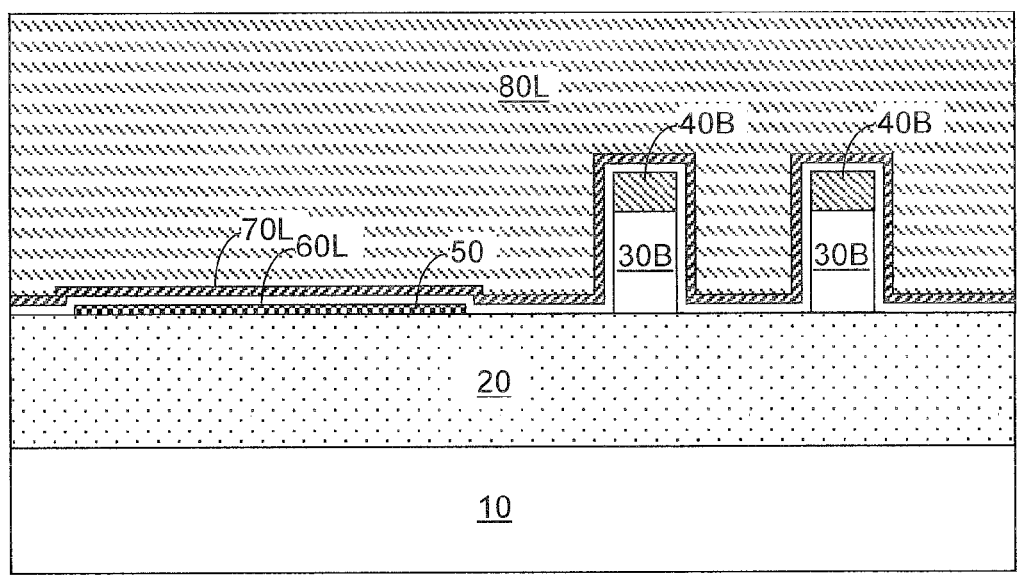
FIG. 15B is a vertical cross-sectional view of the fifth exemplary semiconductor structure along the plane X-X' in FIG. 15A according to the fifth embodiment of the present invention.

Referring to FIGS. 15A and 15B, the processing steps of FIGS. 5A and 5B can be performed as in the first embodiment to deposit a dielectric layer 60L and at least one upper conductive layer. The interface between the top surface of the lower conductive plate 50 and the dielectric layer 60L is planar, i.e., horizontal. Further, the interface between the portion of the top surface of the dielectric layer 60L and the at least one upper conductive layer (70L, 80L) over the lower conductive plate is also planar.

Figure 16A:
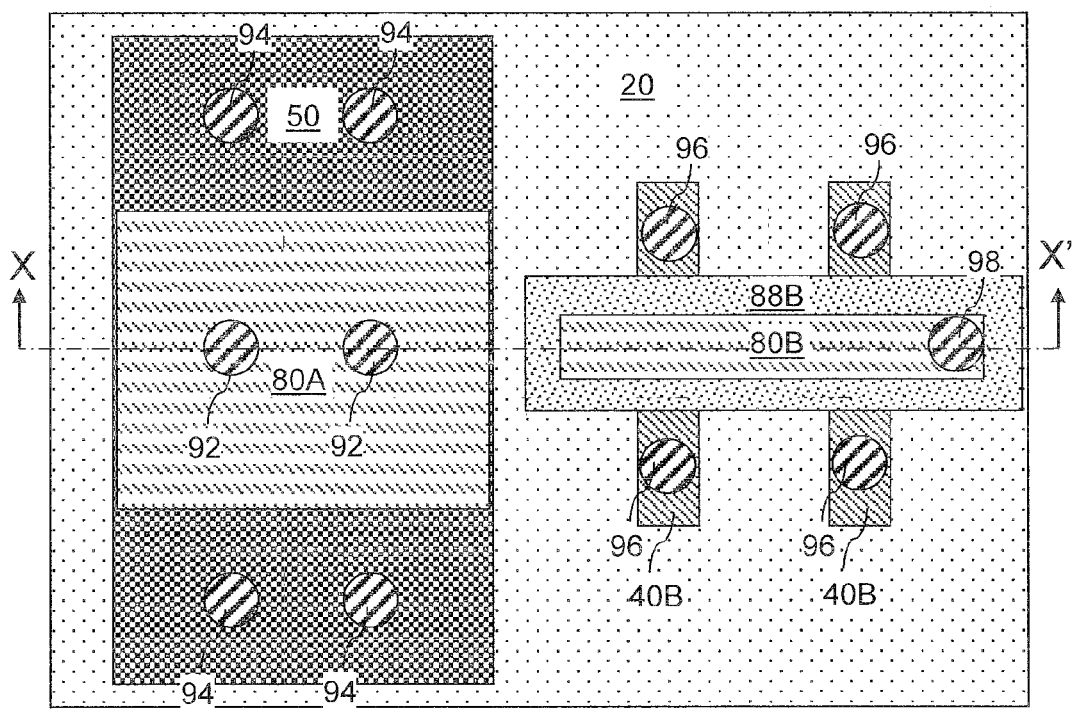
FIG. 16A is a top-down view of the fifth exemplary semiconductor structure after deposition of a MOL dielectric layer and formation of contact via structures according to the fifth embodiment of the present invention. The MOL dielectric layer is omitted from the view for clarity.
Figure 16B:
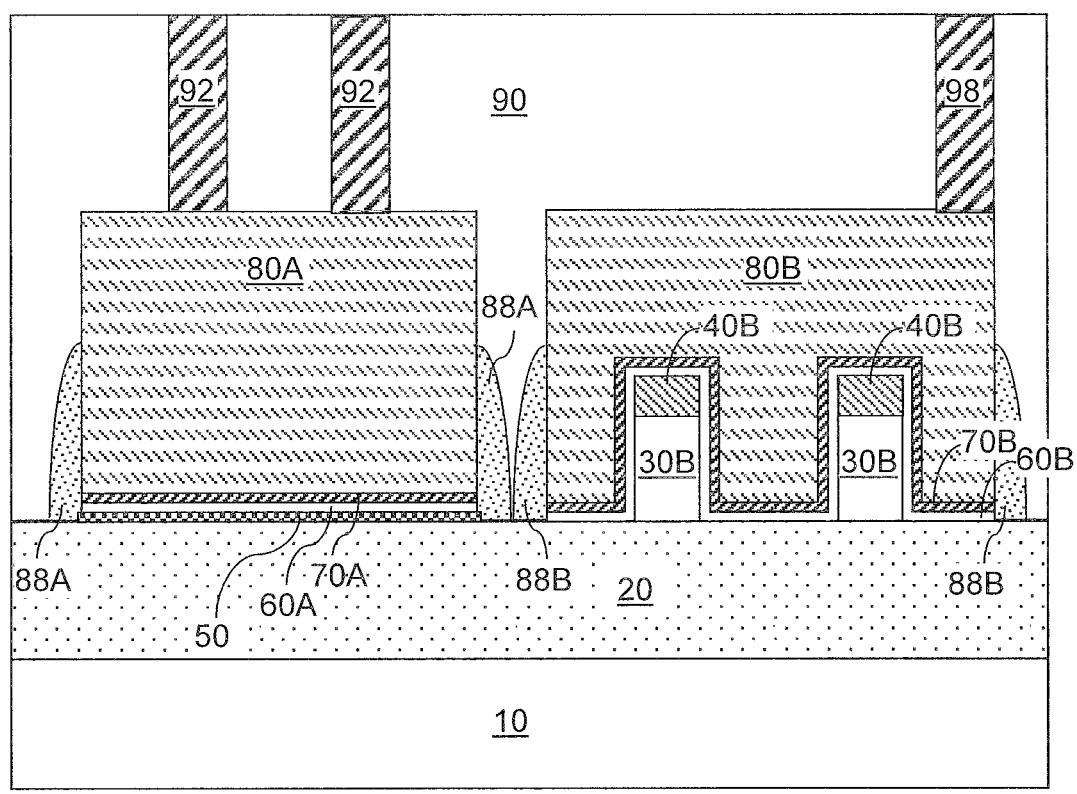
FIG. 16B is a vertical cross-sectional view of the fifth exemplary semiconductor structure along the plane X-X' in FIG. 16A according to the fifth embodiment of the present invention. The MOL dielectric layer is shown.

Referring to FIGS. 16A and 16B, the processing steps of FIGS. 6A, 6B, 7A, and 7B can be performed as in the first embodiment. The MOL dielectric layer 90 is omitted from the top-down view of FIG. 16A for clarity. The fifth exemplary semiconductor structure includes a capacitor. The capacitor includes the lower conductive plate 50, the node dielectric 60A, and the upper conductive plate that includes a stack of a first metallic conductive portion 70A and a first doped semiconductor material portion 80A. Because the capacitor of the fifth embodiment is formed on a planar top surface of the insulator material layer 20, all interfaces within the capacitor (50, 60A, 70A, 80A) can be planar, i.e., horizontal. The finFETs of the fifth exemplary semiconductor structure can be dual gate FETs.

In a first variation of the fifth exemplary semiconductor structure, the formation of the fin cap dielectric layer 40L can be omitted as in the second and fourth embodiment. In this case, the at least one first dielectric fin cap portion 40A and the at least one second dielectric fin cap portion 40B are not formed. The top surfaces of the at least one second semiconductor material portion 30B contacts a bottom surface of the gate dielectric 60B. The finFETs are trigate FETs in this case.

In a second variation of the fifth exemplary semiconductor structure, an exposed planar top surface area PA of FIGS. 12A and 12B can be recessed to a recess depth rd employing the methods of FIGS. 9A and 9B. A planar capacitor is formed on the recessed surface of the insulator material layer 20.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A structure comprising a metal-insulator-metal (MIM) capacitor, wherein said MIM capacitor comprises:
   a semiconductor material portion that is located on an insulator material layer of a substrate;
   a fin structure having a same width throughout and including a sub-portion of said semiconductor material portion;
   a lower conductive plate contacting a surface of said insulator material layer and sidewalls of said fin structure;
   a node dielectric contacting said lower conductive plate; and
   an upper conductive plate contacting said node dielectric, wherein said fin structure includes a stack, from bottom to top, of an insulator material portion, said sub-portion of said semiconductor material portion, and a fin cap dielectric portion, wherein said insulator material portion and said insulator material layer have a same composition, said lower conductive plate contacts said fin cap dielectric portion.

2. The structure of claim 1, wherein said lower conductive plate includes a metallic conductive material.

3. The structure of claim 1, wherein said fin structure includes a stack, from bottom to top, of said sub-portion of said semiconductor material portion and a fin cap dielectric portion, wherein said lower conductive plate contacts sidewalls and a top surface of said fin cap dielectric portion.

4. The structure of claim 1, wherein sidewalls of said sub-portion of said semiconductor material portion contact said lower conductive plate.

5. The structure of claim 1, wherein an entirety of a bottom surface of said lower conductive plate contacts a planar top surface of said insulator material layer.

6. The structure of claim 5, wherein said upper conductive plate and a gate electrode of a field effect transistor including said fin structure comprise a same conductive material.

7. The structure of claim 1, wherein said structure further comprises a field effect transistor located on said insulator material layer and comprising an additional fin structure, and a gate dielectric contacting sidewalls of said additional fin structure and said node dielectric have a same composition.

8. The structure of claim 1, wherein further comprising:
   a first pad portion adjoined to one end of said fin structure and having a width greater than said same width and including at least another sub-portion of said semiconductor material portion; and
   a second pad portion adjoined to another end of said fin structure and having a width greater than said same width and including at least yet another sub-portion of said semiconductor material portion.

9. The structure of claim 7, wherein said upper conductive plate and a gate electrode of a field effect transistor comprise a same conductive material.

10. The structure of claim 9, wherein each of said upper conductive plate and said gate electrode of said field effect transistor includes a stack, from bottom to top, of a metallic conductive material and a doped semiconductor material.

11. The structure of claim 7, wherein said gate dielectric and said node dielectric comprises a metal-oxide-containing dielectric material.

12. The structure of claim 8, further comprising at least another fin structure located on said insulator material layer and comprising at least even another sub- portion of said semiconductor material portion and adjoined to said first pad portion and said second pad portion, wherein said lower conductive plate contacts sidewalls of said at least another fin structure.

13. A method of forming a structure comprising a metal-insulator-metal (MIM) capacitor, said method comprising:
   forming a fin structure having a same width throughout, said fin structure including a sub-portion of a semiconductor material portion that is located on an insulator material layer of a substrate;
   forming a lower conductive plate directly on a surface of said insulator material layer and sidewalls of said fin structure;
   forming a node dielectric directly on said lower conductive plate by depositing and patterning a dielectric layer; and
   forming an upper conductive plate directly on said node dielectric,
   wherein said structure further comprises a field effect transistor, and said method further comprises:
   forming an additional fin structure on said insulator material layer, wherein said dielectric layer is simultaneously deposited on said fin structure and said additional fin structure; and
   forming a gate dielectric contacting sidewalls of said additional fin structure by patterning said dielectric layer.

14. The method of claim 13, wherein said structure further comprises a field effect transistor, and said method further comprises:
   forming an additional fin structure on said insulator material layer, wherein said dielectric layer is simultaneously deposited on said fin structure and said additional fin structure;
   forming a gate dielectric contacting sidewalls of said additional fin structure by patterning said dielectric layer.

15. The method of claim 13, wherein an entirety of a bottom surface of said lower conductive plate contacts a planar top surface of said insulator material layer.

16. The method of claim 14, wherein said upper conductive plate and a gate electrode of a field effect transistor are formed by patterning a same contiguous conductive material layer.

17. The method of claim 16, wherein said upper conductive plate and said gate electrode are patterned simultaneously in a first processing step, and said node dielectric and said gate dielectric are patterned simultaneously in a second processing step.

18. A method of forming a structure comprising a metal-insulator-metal (MIM) capacitor, said method comprising:
- forming a fin structure having a same width throughout, said fin structure including a sub-portion of a semiconductor material portion that is located on an insulator material layer of a substrate;
- forming a lower conductive plate directly on a surface of said insulator material layer and sidewalls of said fin structure;
- forming a node dielectric directly on said lower conductive plate by depositing and patterning a dielectric layer;
- forming an upper conductive plate directly on said node dielectric, and
- patterning at least a semiconductor material layer, wherein patterned portions of said semiconductor material layer comprise;
- said sub-portion of said semiconductor material portion;
- a first pad portion adjoined to one end of said fin structure and having a width greater than said same width; and
- a second pad portion adjoined to another end of said fin structure and having a width greater than said same width.

19. The method of claim 18, further comprising forming at least another fin structure on said insulator material layer, said at least another fin structure comprising at least even another sub-portion of said semiconductor material portion and adjoining said first pad portion and said second pad portion, wherein said lower conductive plate is formed directly on sidewalls of said at least another fin structure.

20. The method of claim 18, wherein an entirety of a bottom surface of said lower conductive plate contacts a planar top surface of said insulator material layer.

\* \* \* \* \*